United States Patent [19]
Choi

[11] Patent Number: 5,907,779
[45] Date of Patent: May 25, 1999

[54] SELECTIVE LANDING PAD FABRICATING METHODS FOR INTEGRATED CIRCUITS

[75] Inventor: Jin-gyoo Choi, Kyungki-do, Rep. of Korea

[73] Assignee: Samsung Electronics Co., Ltd., Suwon, Rep. of Korea

[21] Appl. No.: 08/730,374

[22] Filed: Oct. 15, 1996

[51] Int. Cl.⁶ ............................................... H01L 21/336
[52] U.S. Cl. ..................... 438/279; 438/201; 438/203; 438/279; 438/287
[58] Field of Search .................................. 438/201, 203, 438/279, 280, 287, FOR 168

[56] References Cited

U.S. PATENT DOCUMENTS 4,221,044  9/1980  Godejahn, Jr. et al. ............... 438/287
4,516,313  5/1985  Turi et al. ............................. 438/287
4,992,389  2/1991  Ogura et al. ......................... 438/279
5,183,773  2/1993  Miyata .................................. 438/201

Primary Examiner—Peter Toby Brown
Assistant Examiner—Khanh Duong
Attorney, Agent, or Firm—Myers Bigel Sibley & Sajovec

[57] ABSTRACT

An integrated circuit is fabricated by forming first source and drain regions and contact regions which electrically contact respective first source and drain regions, for first field effect transistors in an integrated circuit. Then, second source and drain regions for second field effect transistors in the integrated circuit are formed. By simultaneously forming landing pads which electrically contact the integrated circuit substrate between first spaced apart gates, and doping the integrated circuit substrate which electrically contacts the landing pads, an additional protective layer may not be needed, thereby simplifying the fabrication process.

16 Claims, 6 Drawing Sheets

SELECTIVE LANDING PAD FABRICATING METHODS FOR INTEGRATED CIRCUITS

FIELD OF THE INVENTION

This invention relates to integrated circuit fabrication methods, and more particularly to methods for forming contact regions for integrated circuits.

BACKGROUND OF THE INVENTION

As the integration density of integrated circuits continues to increase, the size of the individual active devices such as field effect transistors, also generally continue to decrease. With the decreased feature size, it may become increasingly difficult to electrically contact the active device regions.

For example, a dynamic random access memory (DRAM) integrated circuit device generally includes contact windows which connect a cell transistor source region to a respective storage electrode of a cell capacitor. Contact windows are also included to connect the cell transistor drain regions to respective bit lines. In order to increase the device integration, the contact windows preferably should be small, preferably smaller than the resolution limits of the exposure tools which are used to form the device.

Self-aligned integrated circuit fabrication methods have been developed to form small contact windows. One example of a self-aligned method forms a self-aligned contact window which exposes the source and drain regions and forms a landing pad on the exposed source and drain regions to permit contact to a storage electrode or bit line as required. FIGS. 1A–1I are cross-sectional views which illustrate a method of fabricating field effect transistors in a conventional semiconductor memory device using self-aligned contact window formation and landing pad formation.

Referring now to FIG. 1A, an integrated circuit memory device includes a cell array portion which includes a plurality of memory cells therein, and a peripheral circuit portion which includes a plurality of peripheral circuit transistors. As shown in FIG. 1A, a plurality of spaced apart gates are formed on an integrated circuit substrate. In particular, a plurality of gate electrodes 12 are formed on an oxide layer 9 on a semiconductor substrate 10. The gate electrodes 12 are covered by a capping layer 11. A plurality of P-type source/drain regions 14 and N-type source/drain regions 16 having relatively low doping concentrations, are formed by implanting P- and N-type dopants into the PMOS and NMOS transistor regions respectively, using the gates as a mask. A first insulating layer 18 is then formed by coating the substrate with an insulating material such as silicon dioxide. A second insulating layer 20 is then formed by coating the first insulating layer 18 with a second insulating material such as silicon nitride.

Referring now to FIG. 1B, the substrate is then coated with a photoresist which is then patterned to form a first photoresist pattern 22 which exposes the peripheral circuit portion of the device. First spacers 24 are then formed on the sidewalls of the gate electrodes 12 of the peripheral circuit portion by anisotropically etching the exposed first insulating layer 18 using the first photoresist pattern 22 as an etch mask.

Then, in FIG. 1C, the first photoresist pattern 22 is removed. The surface of the substrate is coated with photoresist and patterned to form a second photoresist pattern 26 which exposes only the NMOS transistors of the peripheral circuit portion. The source/drain regions 17 of the NMOS transistors in the peripheral circuit portion are then formed by implanting high concentrations of N-type dopants.

Referring now to FIG. 1D, the second photoresist pattern 26 is removed and the substrate is again coated with photoresist and patterned to form a third photoresist pattern 28 which exposes only the PMOS transistors of the peripheral circuit portion. Source/drain regions 15 of the PMOS transistors of the peripheral circuit portion are then formed by doping P-type dopant at high concentration.

Referring now to FIG. 1E, the third photoresist pattern 28 is removed and an insulating layer 30 is formed on the substrate. A photoresist is formed on a substrate and patterned to form a fourth photoresist pattern 32 which exposes the cell array portion of the integrated circuit. Then, as shown in FIG. 1F, the fourth photoresist pattern 32 is used as an etch mask and the insulating layer 30 in the cell array portion is removed using dry or wet etching. The insulating layer 30 which protects the peripheral circuit portion, remains in the peripheral circuit portion.

Referring now to FIG. 1G, the second insulating layer 20 is removed by dry or wet etching. Second sidewall spacers 25 are then formed on the sidewalls of the gate electrodes 12 of the cell array portion by anisotropically etching the first insulating layer 18. The fourth photoresist pattern 32 is then removed.

Referring now to FIG. 1H, source/drain regions 19 having relatively high doping concentrations, are then formed in the cell array portion transistors by forming a polycrystalline silicon (polysilicon) layer 34 on the surface of the substrate and doping the polysilicon layer with N-type impurities. A fifth photoresist pattern 36 is then formed on the polysilicon layer 34. The fifth photoresist pattern 36 is then patterned to permit forming of landing pads.

Finally, in FIG. 1I, a landing pad 35 which contacts the source/drain 19 of the transistors of the cell array portion is formed by anisotropically etching the polysilicon layer 34, using the fifth photoresist pattern as an etch mask.

Unfortunately, in the above-described method, the source/drain region 19 of the cell array transistors and the landing pads 35 therefor are formed after the source/drain regions 15 of the peripheral circuit portion transistors. This may complicate the fabrication process because of the insulating layer 30 which protects the peripheral circuit portion during landing pad fabrication. This process complexity may increase the manufacturing cost and decrease the device yields.

SUMMARY OF THE INVENTION

It is therefor an object of the present invention to provide improved methods of fabricating integrated circuits including landing pads.

It is another object of the present invention to provide integrated circuit fabrication methods which may be used to fabricate integrated circuit devices with reduced cost and high yields.

These and other objects are provided, according to the present invention, by fabricating integrated circuits by first forming a plurality of first source and drain regions and a plurality of contact regions which electrically contact the plurality of first source and drain regions, for a plurality of first field effect transistors in the integrated circuit. Then, a plurality of second source and drain regions for a plurality of second field effect transistors in the integrated circuit are formed. By forming the first source and drain regions and the contact regions for the first field effect transistors prior to forming the source and drain regions for the second field effect transistors, an insulating layer to protect the second field effect transistors may not be required. Reduced cost and improved yields may thereby be obtained.

In a preferred embodiment of the present invention, the step of forming a plurality of first source and drain regions and a plurality of contact regions includes the steps of forming a plurality of spaced apart gates on an integrated circuit substrate and forming a layer on the spaced apart gates and on the integrated circuit substrate therebetween. The layer is doped to thereby dope the integrated circuit substrate between the spaced apart gates and thereby form the plurality of first source and drain regions. At least a portion of the layer on the gates is removed to thereby define the plurality of contact regions. In one embodiment, the removing step is performed after the doping step. In another embodiment, the doping step is performed after the removing step. In yet another embodiment, the integrated circuit substrate between the plurality of spaced apart gates is doped to thereby form the plurality of first source and drain regions. The layer which is formed on the plurality of spaced apart gates and on the integrated circuit substrate therebetween need not be doped.

The step of forming a plurality of second source and drain regions for a plurality of second field effect transistors in the integrated circuit preferably comprises the step of doping the plurality of second source and drain regions while simultaneously doping the plurality of contact regions which electrically contact the plurality of first source and drain regions. Thus, additional doping may be provided in the contact regions to reduce the contact resistance thereof.

It will be understood that the integrated circuit is preferably an integrated circuit memory device, wherein the plurality of first field effect transistors are a plurality of memory cell transistors and wherein the plurality of second field effect transistors are a plurality of memory device peripheral circuit transistors. The plurality of memory cell transistors are preferably of a first conductivity type and the memory device peripheral circuit transistors are preferably of the first conductivity type and of a second conductivity type.

The present invention may also be regarded as methods of simultaneously forming landing pads and doping the integrated circuit substrate which electrically contacts the landing pads. In particular, a layer is formed on the plurality of spaced apart gates on an integrated circuit substrate and on the integrated circuit substrate therebetween. The layer is selectively anisotropically etched on first ones of the spaced apart gates to form first spacers on the sidewalls of the first ones of the spaced apart gates. The layer remains on second ones of the spaced apart gates. A plurality of landing pads which electrically contact the integrated circuit substrate between the first ones of the spaced apart gates are formed, while simultaneously doping the integrated circuit substrate which electrically contacts the landing pads. Then, the layer on the second ones of the spaced apart gates is selectively anisotropically etched to form second spacers on the sidewalls of the second ones of the spaced apart gates.

In particular, the step of simultaneously forming and doping comprises the steps of doping the layer on the first ones of the spaced apart gates, to thereby form a plurality of landing pads and simultaneously doping the integrated circuit substrate between the first ones of the spaced apart gates. At least a portion of the layer on the gates is removed to thereby define the plurality of landing pads. As was described above, the doping step may also be performed prior to or after the removing step. After the layer on the second ones of the spaced apart gates is selectively anisotropically etched, the integrated circuit substrate is doped between the second ones of the spaced apart gates.

A specific embodiment of a method of fabricating an integrated circuit according to the present invention forms a plurality of spaced apart first and second gates on an integrated circuit substrate. A first layer is formed on the plurality of spaced apart first and second gates and on the integrated circuit substrate therebetween. The first layer on the second gates and on the integrated circuit substrate therebetween is masked. The first layer on the first gates and on the integrated circuit substrate therebetween is anisotropically etched to form first spacers on the sidewalls of the first gates. A second layer is formed on the first spacers and on the first gates. The second layer on the first gates is patterned to form landing pads which electrically contact the integrated circuit substrate between the first spacers.

The first layer is anisotropically etched on first selected ones of the second gates to form second spacers on the sidewalls of the first selected ones of the second gates. The integrated circuit is doped with dopants of a first conductivity type, to form doped regions of the first conductivity type in the integrated circuit substrate between the first selected ones of the second gates. The first layer is anisotropically etched on second selected ones of the second gates to form third spacers on the sidewalls of the second selected ones of the second gates. Doped regions of second conductivity type are then formed in the integrated circuit substrate between the second selected ones of the second gates.

The step of doping the integrated circuit with dopants of a first conductivity type preferably comprises the step of doping the integrated circuit with dopants of a first conductivity type to form doped regions of the first conductivity type in the integrated circuit between the first gates and between the first selected ones of the second gates. Thus, the cell array transistors and the peripheral circuit portion transistors of the same conductivity type may be doped simultaneously. After anisotropically etching the first layer on the first gates on the integrated circuit substrate therebetween to form first spacers on the sidewalls of the first gates, the integrated circuit is preferably doped with dopants of a first conductivity type to form doped regions of the first conductivity type in the integrated circuit substrate between the first gates. Simplified methods with decreased costs and increased yields may thereby be provided.

DETAILED DESCRIPTION OF PREFERRED EMBODIMENTS

Figure 1A:
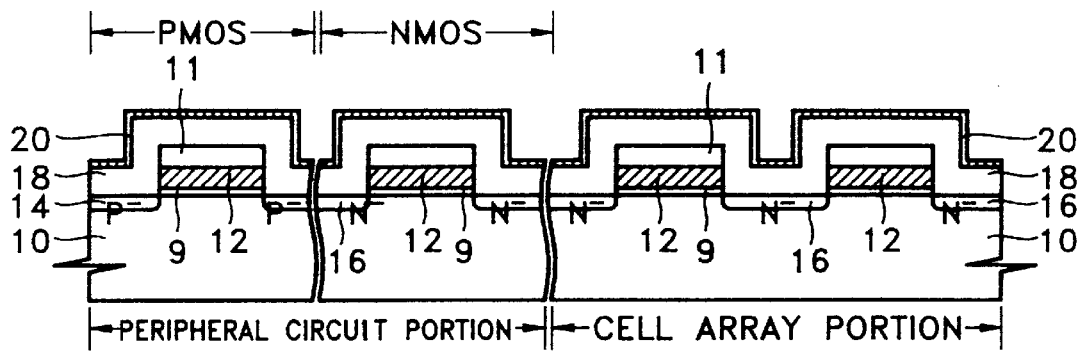
FIGS. 1A–1I are cross-sectional views illustrating a conventional method for fabricating a conventional integrated circuit memory device.
Figure 1B:
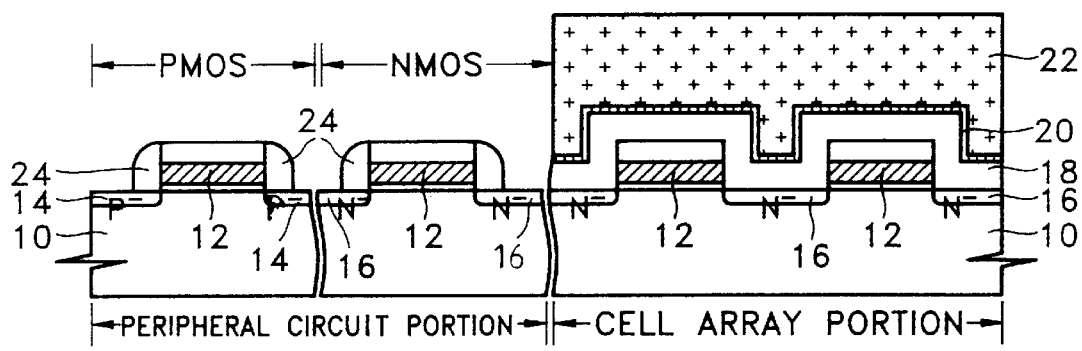
Figure 1C:
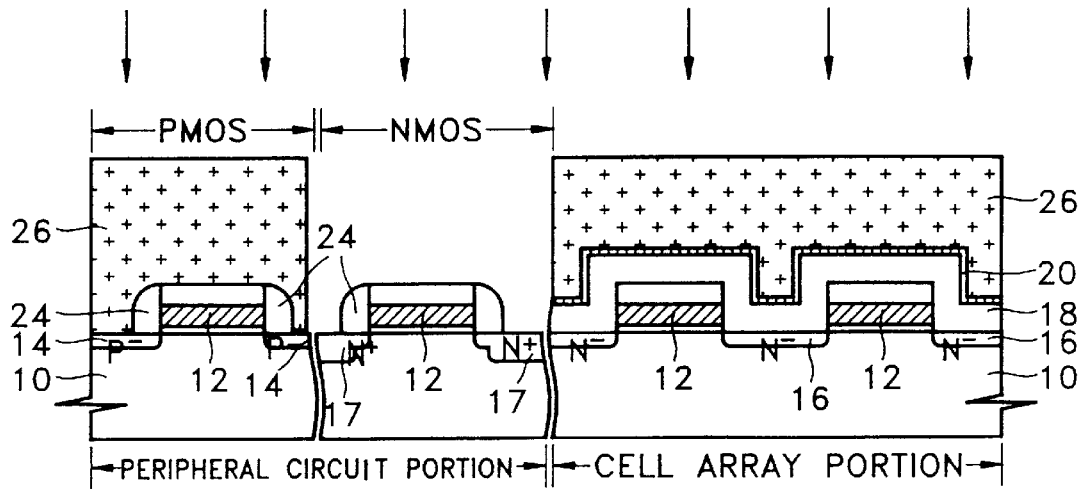
Figure 1D:
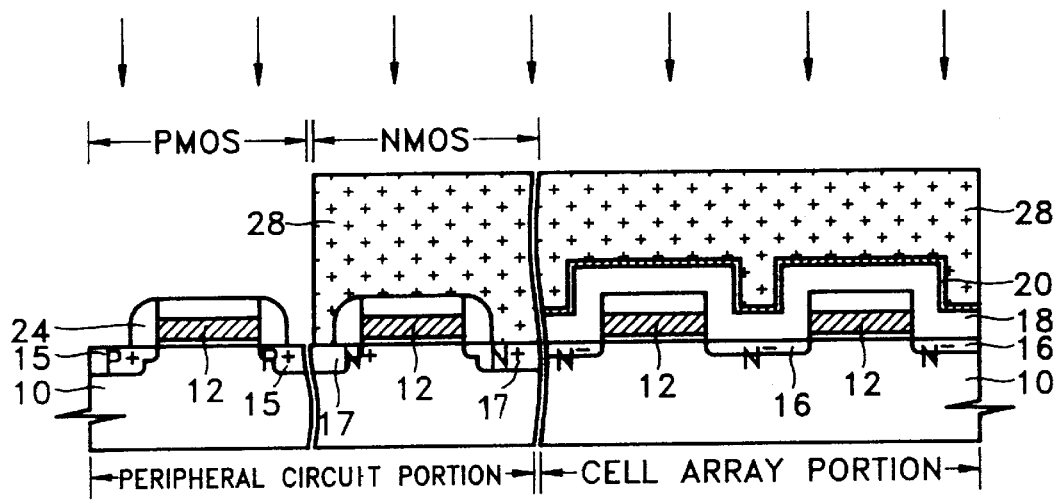
Figure 1E:
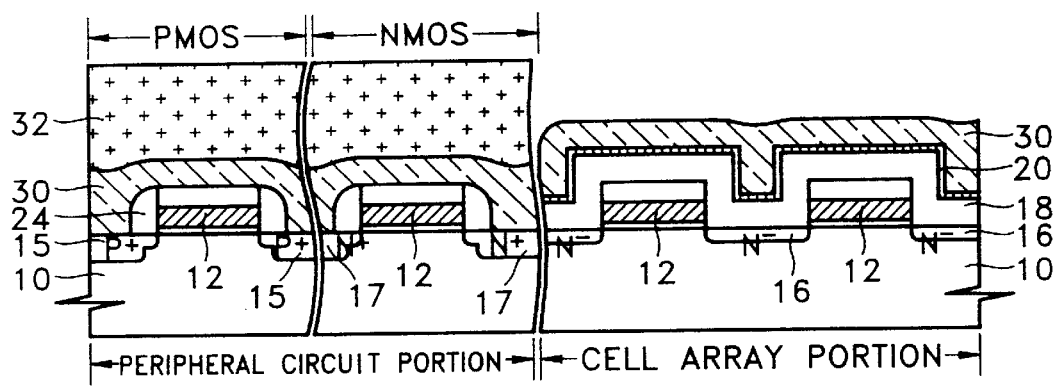
Figure 1F:
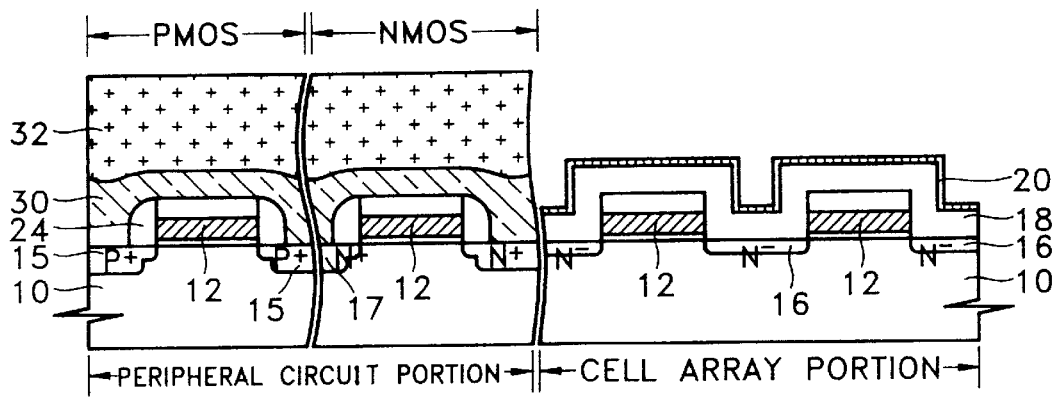
Figure 1G:
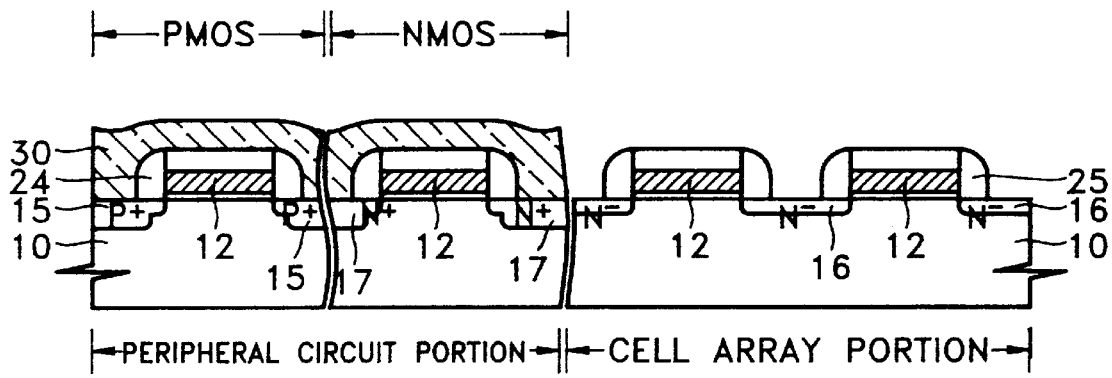
Figure 1H:
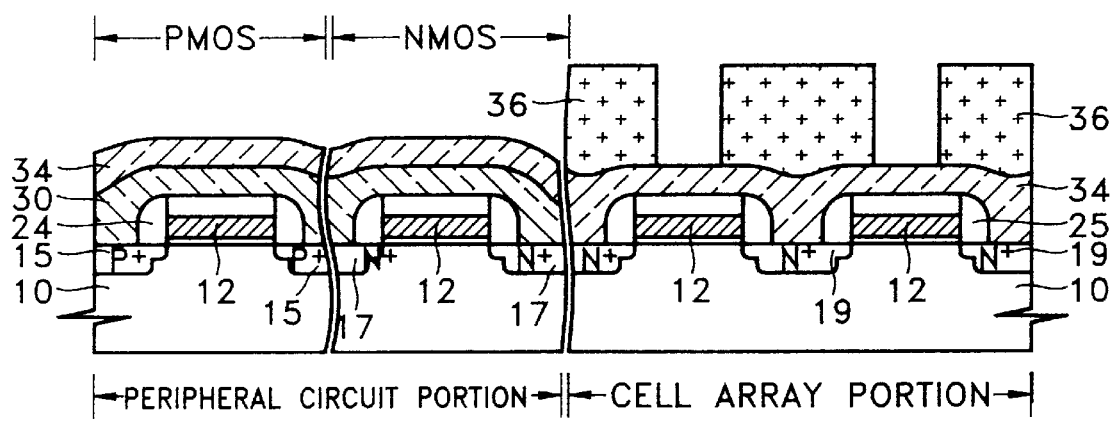
Figure 1I:
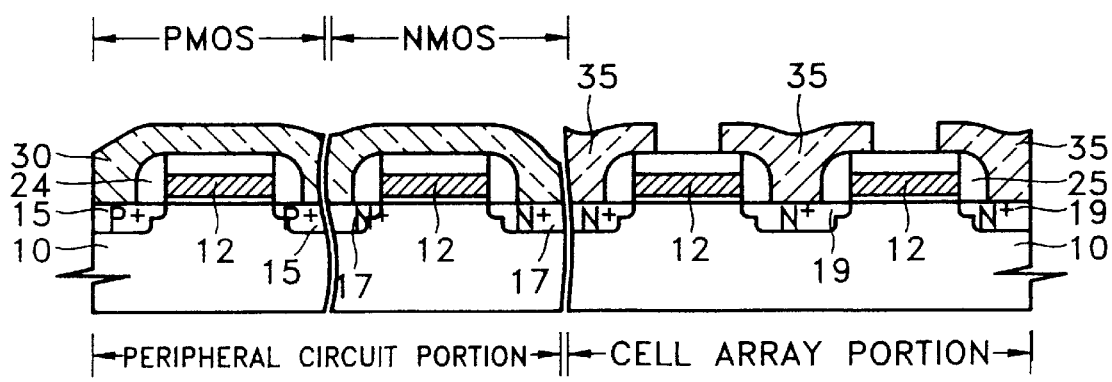

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. Moreover, the terms "first conductivity type" and "second conductivity type" refer to opposite conductivity types such as P- or N-type; however, each embodiment described and illustrated herein includes its complementary embodiment as well.

Figure 2A:
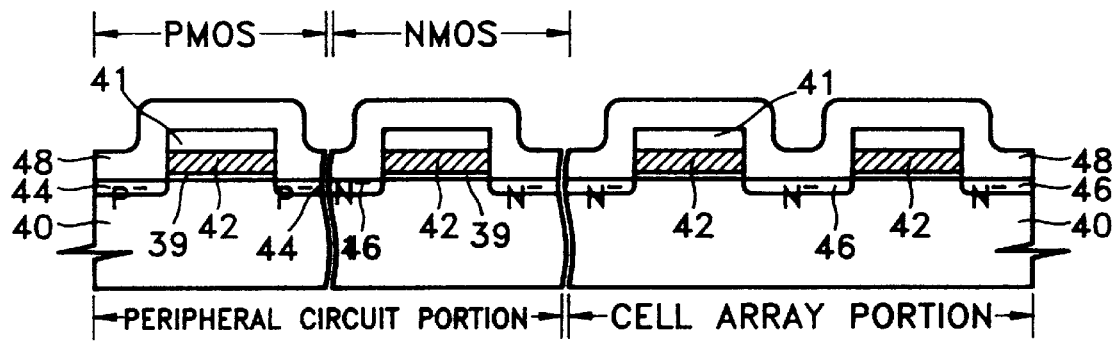
FIGS. 2A–2G are cross-sectional views illustrating methods for fabricating an integrated circuit memory device according to an embodiment of the present invention.

Referring now to FIG. 2A, a plurality of spaced apart first and second gates are formed on an integrated circuit substrate and a first layer is formed on the plurality of spaced apart first and second gates and on the integrated circuit substrate therebetween. In particular, a gate oxide layer is formed on an integrated circuit substrate 40 and a layer for forming a gate electrode is formed thereon. An oxide layer is then formed on the gate electrode forming layer. The gate oxide layer, gate electrode forming layer and oxide layer are then patterned in order to form gate electrodes 42 having a gate oxide layer between the gate electrode 42 and the semiconductor substrate and a capping layer 41 thereon opposite the gate oxide layer 39. P-type source/drain regions 44 and N-type source/drain regions 46 having low doping concentrations are formed by implanting P- and N-type dopants respectively into the regions which will form PMOS and NMOS transistors, using the gate electrodes 42 as ion implantation masks. A first insulating layer 48 is then formed by coating the surface of the substrate with an insulating material such as silicon dioxide. The gate electrodes are preferably formed of polysilicon. The P-type impurity is preferably phosphorus or arsenic and the P-type impurity is preferably boron.

Figure 2B:
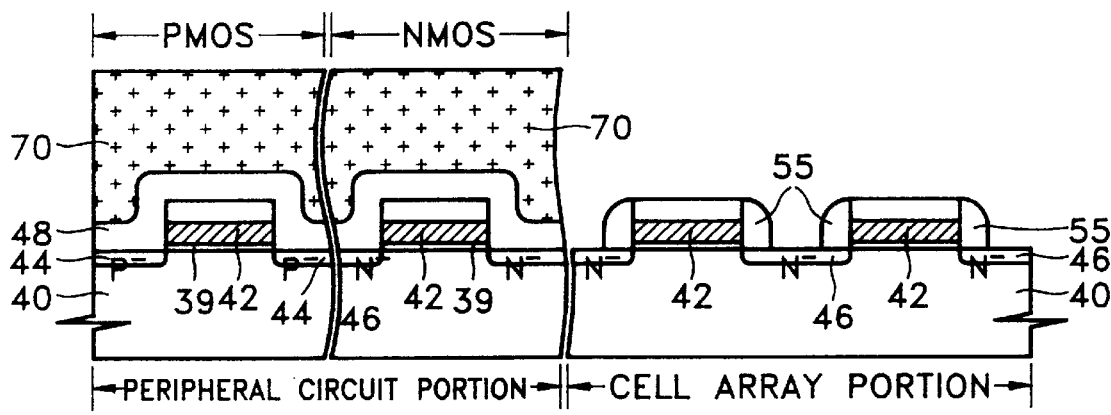

Referring now to FIG. 2B, the first layer is masked on the second gates and on the integrated circuit substrate therebetween. As shown, a photoresist is coated on the substrate and patterned to form first photoresist pattern 70 which exposes the cell array portion and masks the peripheral circuit portion. Spacers 55 are formed on the sidewalls of the gate electrodes 42 in the cell array portion by anisotropically etching the exposed first insulating layer 48.

Figure 2C:
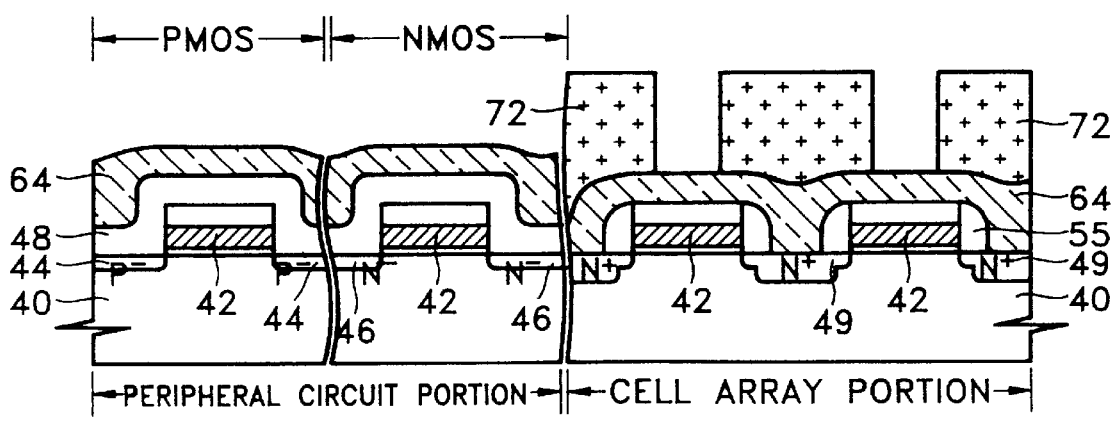

Referring to FIG. 2C, a second layer is formed on the first spacers and on the first gates. In particular, the first photoresist pattern is removed and a layer 64, preferably conductive polysilicon, is formed on the substrate. The conductive layer 64 is doped with first conductivity dopants. A second photoresist pattern 72 is formed on layer 64 by coating the substrate with photoresist and patterning the photoresist.

Still referring to FIG. 2C, the dopants in the conductive layer 64 preferably diffuse into the semiconductor substrate where the semiconductor substrate contacts the layer 64, to thereby form source/drain regions 49 of the cell array portion. The source/drain regions 49 preferably have relatively high doping concentrations. It will also be understood that the step of doping the source and drain regions 49 can be performed prior to depositing the conductive layer 64. Alternatively, the doping step may be performed after forming the landing pads, which is described in connection with FIG. 2D.

Figure 2D:
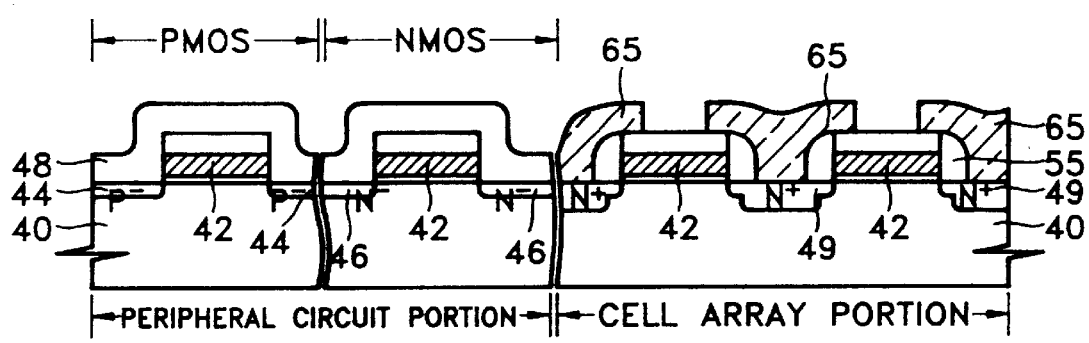

Referring now to FIG. 2D, landing pads 65 are formed by anisotropically etching the conductive layer 64 using the second photoresist pattern 72 as an etch mask. The second photoresist layer 72 is then removed.

Figure 2E:
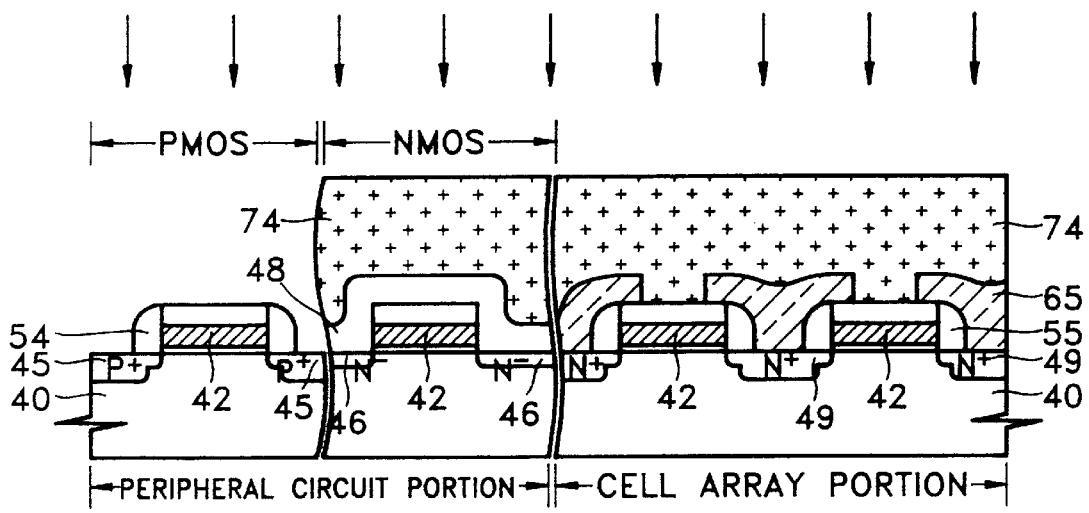

Referring now to FIG. 2E, the first layer is anisotropically etched on first selected ones of the second gates, to form second spacers on the sidewalls of the first selected ones of the second gates, and the integrated circuit is doped with dopants of a first conductivity type to form doped regions of the first conductivity type in the integrated circuit substrate between the first selected ones of the second gates. In particular, a third photoresist pattern 74 is formed to expose only the PMOS transistors of the peripheral circuit portion. Sidewall spacers 54 are then formed on the sidewalls of the gate electrodes 42 of the PMOS peripheral circuit transistors by anisotropically etching the exposed portion of the first insulating layer 48 using the third photoresist pattern 74 as an etch mask. Source/drain regions 45 in the PMOS peripheral circuit transistors are then formed by doping the exposed portion with dopants of second conductivity type. Self-aligned high conductivity source/drain regions 45 are thereby formed for the PMOS peripheral circuit transistors. As shown, P-type dopants such as boron are used.

Figure 2F:
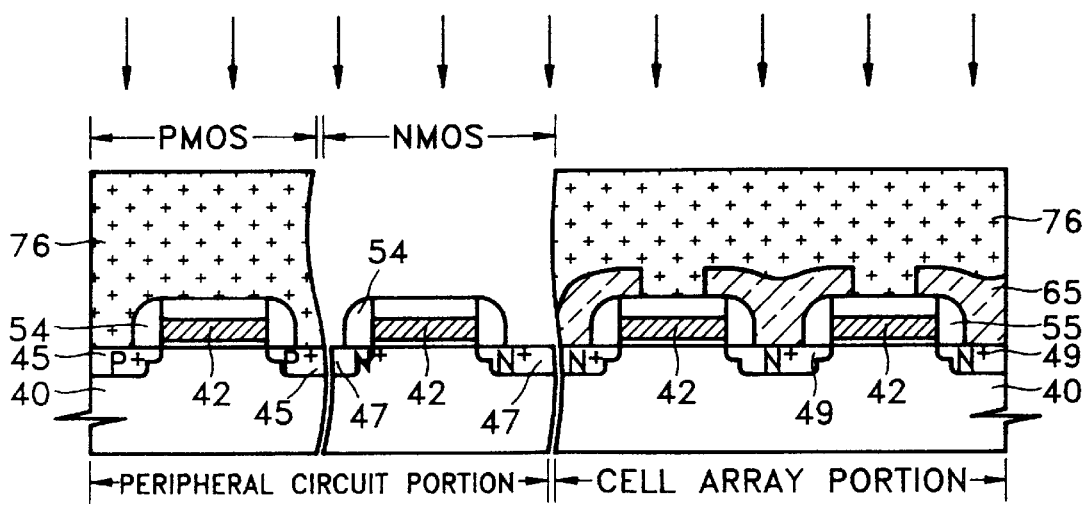
Figure 2G:
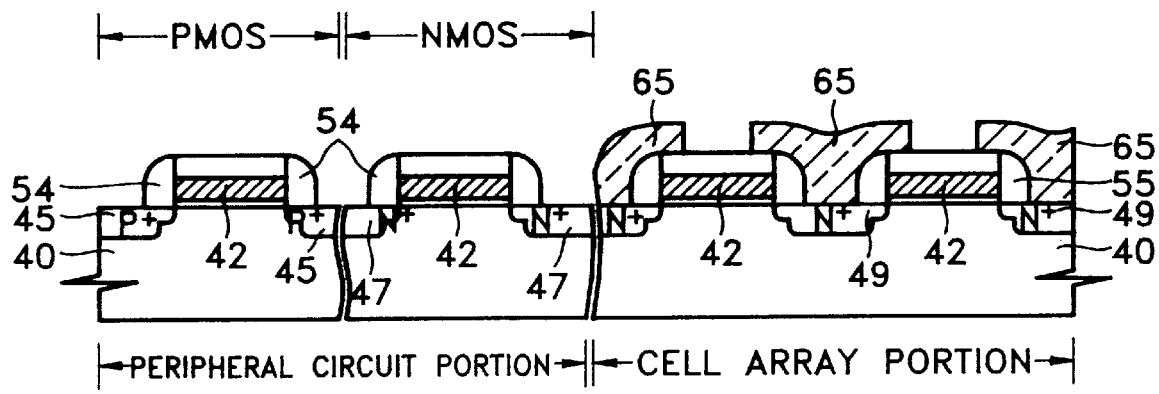

Referring now to FIG. 2F, steps for anisotropically etching the first layer on second selected ones of the second gates to form third spacers on the sidewalls of the second selected ones of the second gates, and forming doped regions of second conductivity type in the integrated circuit substrate between the second selected ones of the second gates are shown. The third photoresist pattern 74 is removed and a fourth photoresist pattern 76 which exposes only the NMOS transistors of the peripheral circuit portion is formed. Spacers 54 are formed on the sidewalls of the gate electrodes 42 of the NMOS transistors by anisotropically etching the exposed portions of the first insulating layer 48 using the fourth photoresist pattern 76 as an etch mask. Source/drain regions 47 for the NMOS peripheral circuit portion transistors having high doping concentration are formed by doping the substrate with first conductivity dopants. High doping concentration, self-aligned source/drain regions 47 are thereby formed. N-type impurity ions such as phosphorus or arsenic may be used. FIG. 2G illustrates the completed structure after removal of the fourth photoresist pattern 76.

Figure 3:
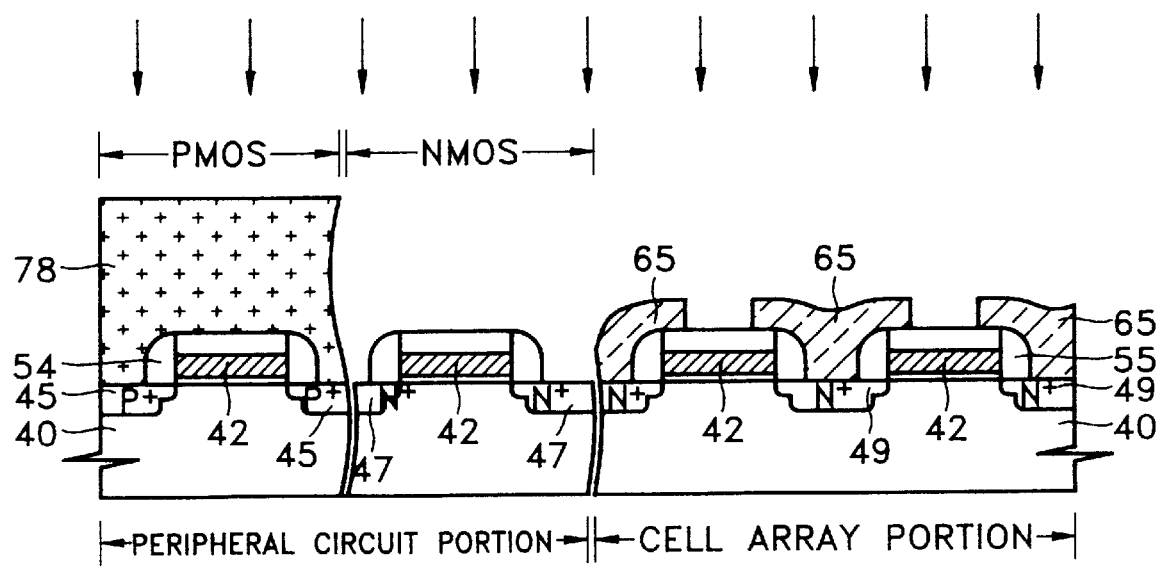
FIG. 3 is a cross-sectional view illustrating another method of fabricating an integrated circuit memory device according to the present invention.

Referring now to FIG. 3, a cross-sectional view of another embodiment of the present invention is illustrated. In particular, in the method shown in FIGS. 2A–2G, and specifically in the steps illustrated in FIG. 2F, doping is performed on the NMOS transistors of the peripheral circuit portion while the cell array portion is covered by the fourth photoresist pattern 76. In contrast, in the embodiment of FIG. 3, this doping is performed using a fifth photoresist pattern 78 which exposes the cell array portion as well as the NMOS transistors of the peripheral circuit portion. By further doping the landing pads 65 during this step, the contact resistance of the landing pads is lowered.

As shown, methods according to the present invention may eliminate the need for an insulating layer to protect the peripheral circuit portion, since the source/drain of the peripheral circuit transistors are formed after forming the source/drain of the cell array portions and the landing pads therefore. Accordingly, the fabrication process may be simplified, thereby reducing costs and improving yields.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. A method of fabricating an integrated circuit comprising the steps of:

forming a plurality of first source and drain regions and a plurality of contact regions which electrically contact the plurality of first source and drain regions, for a plurality of first field effect transistors in the integrated circuit; and then forming a plurality of second source and drain regions for a plurality of second field effect transistors in the integrated circuit, after said step of forming a plurality of first source and drain regions and a plurality of contact regions.

2. A method according to claim 1 wherein said step of first forming a plurality of first source and drain regions and a plurality of contact regions comprises the steps of:

forming a plurality of spaced apart gates on an integrated circuit substrate;

forming a layer on said plurality of spaced apart gates and on the integrated circuit substrate therebetween;

doping the layer to thereby dope the integrated circuit substrate between the spaced apart gates and thereby form the plurality of first source and drain regions; and removing at least a portion of the layer on the gates to thereby define the plurality of contact regions.

3. A method according to claim 2 wherein said doping step is performed after said removing step.

4. A method according to claim 1 wherein said step of first forming a plurality of first source and drain regions and a plurality of contact regions comprises the steps of:

forming a plurality of spaced apart gates on an integrated circuit substrate;

doping the integrated circuit substrate between the plurality of spaced apart gates to thereby form the plurality of first source and drain regions;

forming a layer on the plurality of spaced apart gates and on the integrated circuit substrate therebetween; and removing the layer on the gates to thereby define the plurality of contact regions.

5. A method according to claim 1 wherein said step of first forming a plurality of second source and drain regions for a plurality of second field effect transistors in the integrated circuit comprises the step of:

doping the plurality of second source and drain regions for a plurality of second field effect transistors in the integrated circuit while simultaneously doping the plurality of contact regions which electrically contact the plurality of first source and drain regions.

6. A method according to claim 1 wherein the integrated circuit is an integrated circuit memory device, wherein the plurality of first field effect transistors are a plurality of memory cell transistors and wherein the plurality of second field effect transistors are a plurality of memory device peripheral circuit transistors.

7. A method according to claim 6 wherein the plurality of memory cell transistors are of first conductivity type, and wherein the memory device peripheral circuit transistors are of the first conductivity type and of a second conductivity type.

8. A method of fabricating an integrated circuit comprising the steps of:

forming a layer on a plurality of spaced apart gates on an integrated circuit substrate and on the integrated circuit substrate therebetween;

selectively anisotropically etching the layer on first ones of the spaced apart gates to form first spacers on the sidewalls of the first ones of the spaced apart gates, with the layer remaining on second ones of the spaced apart gates;

simultaneously forming a plurality of landing pads which electrically contact the integrated circuit substrate between the first ones of the spaced apart gates and doping the integrated circuit substrate which electrically contacts the landing pads; and then selectively anisotropically etching the layer on the second ones of the spaced apart gates to form second spacers on the sidewalls of the second ones of the spaced apart gates, after said step of simultaneously forming a plurality of landing pads.

9. A method according to claim 8 wherein said step of simultaneously forming and doping comprises the steps of:

forming a second layer on the first ones of the spaced apart gates to thereby form the plurality of landing pads and doping the integrated circuit substrate between the first ones of the spaced apart gates; and removing at least a portion of the second layer on the first ones of the spaced apart gates to thereby define the plurality of landing pads.

10. A method according to claim 9 wherein said doping step is performed after said removing step.

11. A method according to claim 8 wherein said step of selectively anisotropically etching the layer on the second ones of the spaced apart gates is followed by the step of:

doping the integrated circuit substrate between the second ones of the spaced apart gates.

12. A method according to claim 8 wherein the integrated circuit is an integrated circuit memory device, wherein the first ones of the spaced apart gates are memory cell transistor gates and wherein the second ones of the spaced apart gates are memory device peripheral circuit transistor gates.

13. A method of fabricating an integrated circuit comprising the steps of:

forming a plurality of spaced apart first and second gates on an integrated circuit substrate;

forming a first layer on the plurality of spaced apart first and second gates and on the integrated circuit substrate therebetween;

masking the first layer on the second gates and on the integrated circuit substrate therebetween;

anisotropically etching the first layer on the first gates and on the integrated circuit substrate therebetween to form first spacers on the sidewalls of the first gates without forming second spacers on the sidewalls of the second gates;

forming a second layer on the first spacers and on the first gates;

patterning the second layer on the first gates to form landing pads which electrically contact the integrated circuit substrate between the first spacers;

anisotropically etching the first layer on first selected ones of the second gates to form second spacers on the sidewalls of the first selected ones of the second gates after said step of anisotropically etching the first layer on the first gates; then doping the integrated circuit with dopants of a first conductivity type, to form doped regions of the first conductivity type in the integrated circuit substrate between the first selected ones of the second gates after said step of anisotropically etching the first layer on first selected ones of the second gates; then anisotropically etching the first layer on second selected ones of the second gates to form third spacers on the sidewalls of the second selected ones of the second gates after said step of doping the integrated circuit with dopants of a first conductivity type; and then forming doped regions of second conductivity type in the integrated circuit substrate between the second selected ones of the second gates after said step of anisotropically etching the first layer on second selected ones of the second gates.

14. A method according to claim 13 wherein said step of doping the integrated circuit with dopants of a first conductivity type comprises the step of:

doping the integrated circuit with dopants of a first conductivity type, to form doped regions of the first conductivity type in the integrated circuit substrate between the first gates and between the first selected ones of the second gates.

15. A method according to claim 13 wherein the following step is performed after the step of anisotropically etching the first layer on the first gates and on the integrated circuit substrate therebetween to form first spacers on the sidewalls of the first gates:

doping the integrated circuit with dopants of a first conductivity type, to form doped regions of the first conductivity type in the integrated circuit substrate between the first gates.

16. A method according to claim 13 wherein the integrated circuit is an integrated circuit memory device, wherein the first gates are memory cell transistor gates and wherein the second gates are memory device peripheral circuit transistor gates.

* * * * *